(12) United States Patent
Cui

(10) Patent No.: US 12,238,974 B2
(45) Date of Patent: Feb. 25, 2025

(54) DISPLAY SUBSTRATE AND METHOD FOR MANUFACTURING THE SAME, DISPLAY PANEL, AND DISPLAY APPARATUS

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 477 days.

(21) Appl. No.: 17/638,737

(22) PCT Filed: Feb. 18, 2021

(86) PCT No.: PCT/CN2021/076762
§ 371 (c)(1),
(2) Date: Feb. 25, 2022

(87) PCT Pub. No.: WO2021/164710
PCT Pub. Date: Aug. 26, 2021

(65) Prior Publication Data
US 2022/0223668 A1 Jul. 14, 2022

(30) Foreign Application Priority Data
Feb. 20, 2020 (CN) .......................... 202010105939.X

(51) Int. Cl.
*H10K 59/122* (2023.01)
*H10K 59/35* (2023.01)
*H10K 59/12* (2023.01)

(52) U.S. Cl.
CPC ......... *H10K 59/122* (2023.02); *H10K 59/352* (2023.02); *H10K 59/353* (2023.02); *H10K 59/1201* (2023.02)

(58) Field of Classification Search
None
See application file for complete search history.

(56) References Cited

U.S. PATENT DOCUMENTS

2004/0119066 A1 6/2004 Han et al.
2014/0070175 A1* 3/2014 Kang ................... H10K 59/122
438/34

(Continued)

FOREIGN PATENT DOCUMENTS

CN 1499907 A 5/2004
CN 103545457 A 1/2014
(Continued)

OTHER PUBLICATIONS

The First Office Action for Chinese Patent Application No. 202010105939.X issued by the Chinese Patent Office on Jun. 18, 2021.

(Continued)

*Primary Examiner* — Kyoung Lee
(74) *Attorney, Agent, or Firm* — XSENSUS LLP

(57) ABSTRACT

A display substrate includes a base substrate, a plurality of first electrodes, a first pixel defining layer, and a second pixel defining layer disposed on the base substrate, and light-emitting layers disposed in a plurality of second opening regions. The first pixel defining layer includes a plurality of first opening regions, and each of the first opening regions exposes at least a portion of a first electrode. The second pixel defining layer includes the plurality of second opening regions, each second opening regions corresponds to at least two first opening regions, and the orthogonal projections of the at least two first opening regions on the base substrate are located within the orthogonal projection of the second opening region on the base substrate. The light-emitting layers overspreads the plurality of second opening regions in a plane perpendicular to a thickness direction of the base substrate, respectively.

19 Claims, 10 Drawing Sheets

(56) References Cited

U.S. PATENT DOCUMENTS

2014/0131672 A1     5/2014   Yoon
2016/0035802 A1     2/2016   Wang et al.
2016/0359112 A1*   12/2016   Wang ................... H10K 59/122
2022/0223668 A1     7/2022   Cui

FOREIGN PATENT DOCUMENTS

CN     104465671 A    3/2015
CN     111293152 A    6/2020

OTHER PUBLICATIONS

The Second Office Action for Chinese Patent Application No. 202010105939.X issued by the Chinese Patent Office on Mar. 17, 2022.

* cited by examiner

DISPLAY SUBSTRATE AND METHOD FOR MANUFACTURING THE SAME, DISPLAY PANEL, AND DISPLAY APPARATUS

CROSS-REFERENCE TO RELATED APPLICATIONS

This application is a national phase entry under 35 USC 371 of International Patent Application No. PCT/CN2021/076762, filed on Feb. 18, 2021, which claims priority to Chinese Patent Application No. 202010105939.X, filed on Feb. 20, 2020, which are incorporated herein by reference in their entirety.

TECHNICAL FIELD

The present disclosure relates to the field of display technologies, and in particular, to a display substrate, a display panel, a display apparatus, and a method for manufacturing the display substrate.

BACKGROUND

Electroluminescent display apparatuses have become the mainstream development trend of current display apparatuses due to their advantages of self-luminescence, low power consumption, wide viewing angle, fast response speed, high contrast and the like.

At present, an inkjet printing (IJP) process is generally used to form a light-emitting layer in an opening region of a pixel defining layer.

SUMMARY

In one aspect, a display substrate is provided. The display substrate includes a base substrate, a plurality of first electrodes disposed on the base substrate, a first pixel defining layer disposed on the base substrate, a second pixel defining layer disposed on the base substrate and light-emitting layers disposed in a plurality of second opening regions. The first pixel defining layer includes a plurality of first opening regions, and each first opening region exposes at least a portion of a first electrode of the plurality of first electrodes. The second pixel defining layer includes the plurality of second opening regions, each second opening region corresponds to at least two first opening regions of the plurality of first opening regions, and orthogonal projections of the at least two first opening regions on the base substrate are located within an orthogonal projection of the second opening region on the base substrate. The light-emitting layers overspreads the plurality of second opening regions in a plane perpendicular to a thickness direction of the base substrate, respectively.

In some embodiments, a surface of the first electrode away from the base substrate is closer to the base substrate than a surface of the first pixel defining layer away from the base substrate.

In some embodiments, a surface of the first electrode away from the base substrate is as close to the base substrate as a surface of the first pixel defining layer away from the base substrate.

In some embodiments, a surface of the first electrode away from the base substrate is farther away from the base substrate than a surface of the first pixel defining layer away from the base substrate.

In some embodiments, the display substrate further includes a plurality of auxiliary patterns disposed between the base substrate and the plurality of first electrodes, and the first electrode is disposed on a surface of an auxiliary pattern away from the base substrate.

In some embodiments, an orthogonal projection of a surface of the auxiliary pattern away from the base substrate on the base substrate is located within an orthogonal projection of a surface of the auxiliary pattern proximate to the base substrate on the base substrate.

In some embodiments, the first electrode covers a surface of the auxiliary pattern away from the base substrate and side faces of the auxiliary pattern.

In some embodiments, an orthogonal projection of a surface of the first electrode away from the base substrate on the base substrate is located within an orthogonal projection of a surface of the first electrode proximate to the base substrate on the base substrate.

In some embodiments, the first pixel defining layer covers side faces of the first electrode.

In some embodiments, the first pixel defining layer is directly disposed on the base substrate, and the second pixel defining layer is disposed on a surface of the first pixel defining layer away from the base substrate; or the first pixel defining layer and the second pixel defining layer are both directly disposed on the base substrate.

In some embodiments, an orthographic projection of a surface of the first pixel defining layer proximate to the base substrate on the base substrate is located within an orthographic projection of a surface of the first pixel defining layer away from the base substrate on the base substrate; and an orthographic projection of a surface of the second pixel defining layer away from the base substrate on the base substrate is located within an orthographic projection of a surface of the second pixel defining layer proximate to the base substrate on the base substrate.

In some other embodiments, a material of the first pixel defining layer is the same as a material of the second pixel defining layer.

In some embodiments, a height of the second pixel defining layer is greater than a height of the first pixel defining layer, and the height of the first pixel defining layer and the height of the second pixel defining layer each refer to a dimension in the thickness direction of the base substrate.

In some embodiments, the second opening region corresponds to a row of first opening regions, and the row of first opening regions correspond to a same color; or the second opening region corresponds to a column of first opening regions, and the column of first opening regions correspond to a same color.

In some embodiments, the second opening region corresponds to part of first opening regions in a row of first opening regions, and the part of first opening regions correspond to a same color; or the second opening region corresponds to part of first opening regions in a column of first opening regions, and the part of first opening regions correspond to a same color.

In some embodiments, the display substrate further includes a second electrode disposed on the light-emitting layer; and one of the first electrode and the second electrode is an anode, and another is a cathode.

In another aspect, a display panel is provided. The display panel includes the display substrate as described in any of the above embodiments and an encapsulation layer encapsulating the display substrate.

In yet another aspect, a display apparatus is provided. The display apparatus includes the display panel as described in the above embodiment.

In yet another aspect, a method of manufacturing a display substrate is provided. The method includes: forming a plurality of first electrodes on a base substrate; forming a first pixel defining layer on the base substrate, the first pixel defining layer including a plurality of first opening regions, and each first opening region exposing at least a portion of a first electrode in the plurality of first electrodes; forming a second pixel defining layer on the base substrate, the second pixel defining layer including a plurality of second opening regions, each second opening region corresponding to at least two first opening regions in the plurality of first opening regions, and orthogonal projections of the at least two first opening regions on the base substrate being located within an orthogonal projection of the second opening region on the base substrate; and forming light-emitting layers in the second opening regions, the light-emitting layers overspreading the second opening regions in a plane perpendicular to a thickness direction of the base substrate, respectively.

In some embodiments, before forming the plurality of first electrodes on the base substrate, the method further includes forming a plurality of auxiliary patterns on the base substrate, a first electrode being disposed on an auxiliary pattern.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
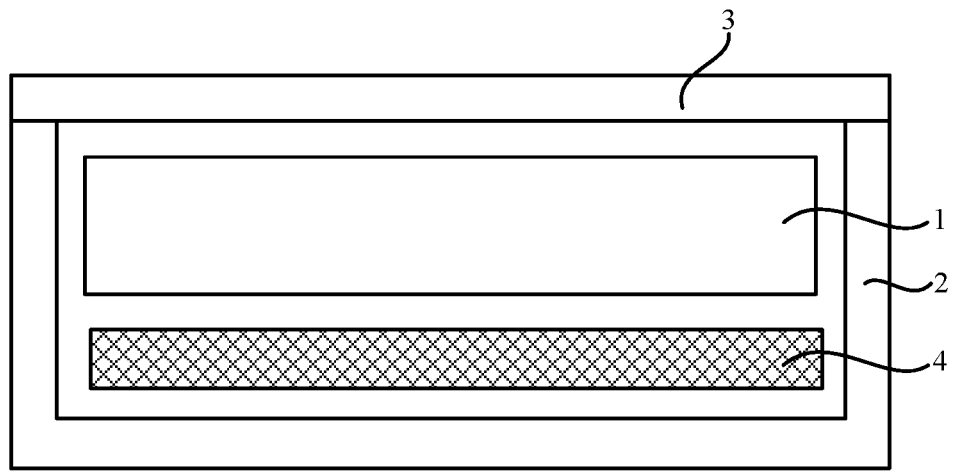
FIG. 1 is a schematic structural diagram of a display apparatus, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example", and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In the description of some embodiments of the present disclosure, orientations or positional relationships indicated by the terms such as "center", "upper", "lower", "front", "behind", "left", "right", "vertical", "horizontal", "top", "bottom", "inner", "outer" and the like are based on the orientations or positional relationships shown in the drawings. They are used merely for convenience in describing the present disclosure and simplifying the description, but not to indicate or imply that the indicated apparatus or element must have a specific orientation, or be constructed and operated in a specific orientation, and thus they cannot be construed as a limitation of the present disclosure.

In the description of some embodiments, terms such as "coupled" and "connected" and their extensions may be used. For example, term "connected" may be used in the description of some embodiments to indicate that two or more components are in direct physical or electrical contact with each other. As another example, term "coupled" may be used in the description of some embodiments to indicate that two or more components are in direct physical or electrical contact. The term "coupled" or "communicatively coupled", however, may also mean that two or more components are not in direct contact with each other, but still cooperate or interact with each other. The embodiments disclosed herein are not necessarily limited to the content herein.

Some embodiments of the present disclosure provide a display apparatus. As shown in FIG. 1, the display apparatus includes a display panel 1, a frame 2, a cover glass 3, a circuit board 4 and other electronic components.

A longitudinal section of the frame 2 is U-shaped. The display panel 1, the circuit board 4 and other electronic components are all disposed in the frame 2. The circuit board 4 is disposed behind the display panel 1, and the cover glass 3 is disposed at a side of the display panel 1 away from the circuit board 4.

The display apparatus may be an organic light-emitting diode (OLED) display apparatus, and in this case, the display panel 1 is an OLED display panel. The display apparatus may also be a quantum dot light-emitting diode (QLED) display apparatus, and in this case, the display panel 1 is a QLED display panel.

Figure 2:
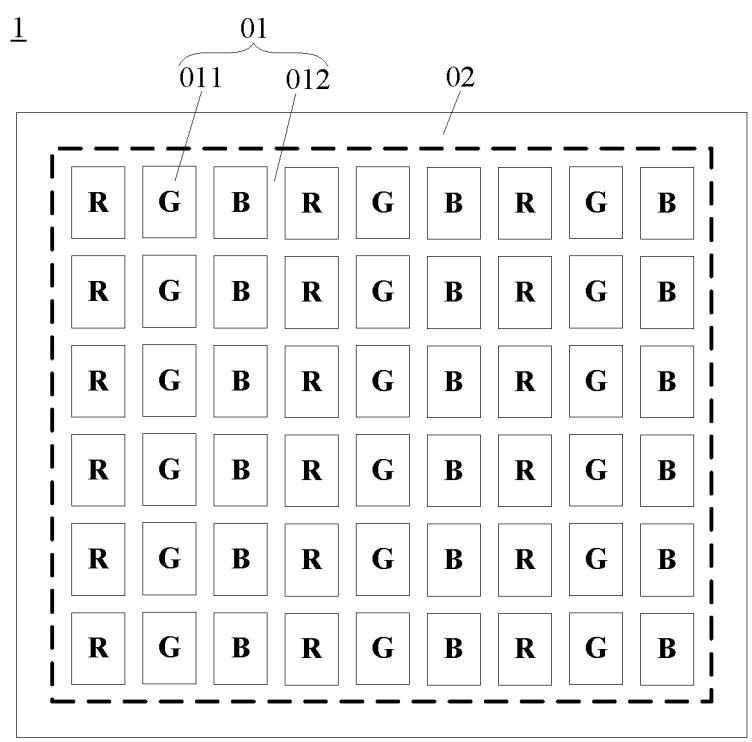
FIG. 2 is a schematic diagram showing a division of a region of a display panel, in accordance with some embodiments.

As shown in FIG. 2, seen from a position facing a display surface of the display panel, the display panel 1 has a display region 01 and a peripheral region 02 located on at least one side of the display region 01. FIG. 2 illustrates an example where the peripheral region 02 surrounds the display region 01. The display region 01 includes a plurality of light-emitting regions 011 (each light-emitting region 011 corresponds to a sub-pixel) and a non-light-emitting region 012. The plurality of light-emitting regions 011 include red light-emitting regions for emitting red light, blue light-emitting regions for emitting blue light, and green light-emitting regions for emitting green light. In some embodiments, as shown in FIG. 2, a column of red light-emitting regions R, a column of green light-emitting regions G and a column of blue light-emitting regions B are alternately arranged in sequence. In some other embodiments, an arrangement order of the red light-emitting regions R, the green light-emitting regions G and the blue light-emitting regions B may be changed. The peripheral region 02 is used for wiring, so that a plurality of sub-pixels in the display region 01 are connected to a gate drive circuit or a source drive circuit through wires. In addition, the gate drive circuit may be provided in the peripheral region 02 by using a gate on array (GOA) technique, so that a size of the peripheral region 02 may be reduced and a narrow bezel of the display apparatus may be realized.

Figure 3:
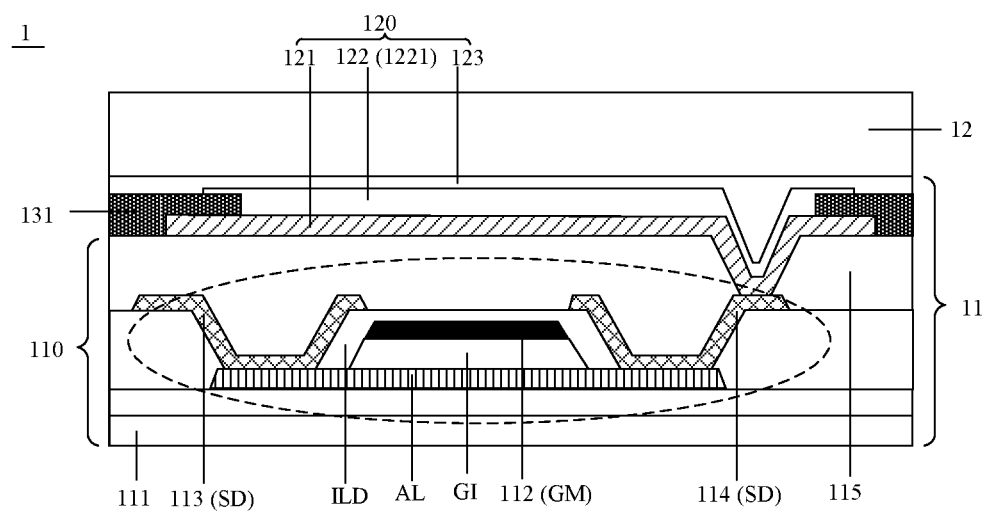
FIG. 3 is a schematic structural diagram of a display panel, in accordance with some embodiments.
Figure 4:
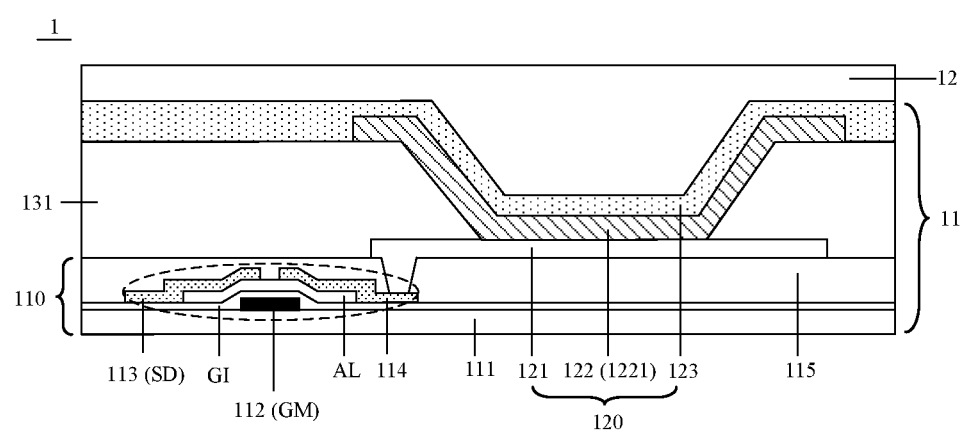
FIG. 4 is a schematic structural diagram of another display panel, in accordance with some embodiments.
Figure 5:
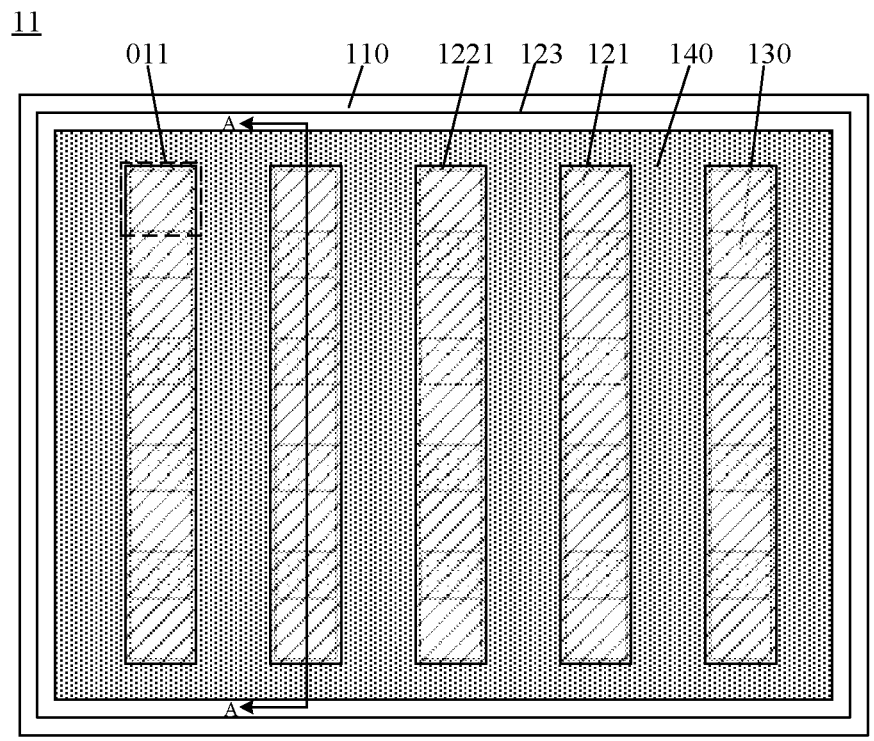
FIG. 5 is a schematic structural diagram of a display substrate, in accordance with some embodiments.

FIGS. 3 and 4 are schematic structural diagrams of display panels. A difference between FIG. 3 and FIG. 4 mainly lies in that structures of thin film transistors in FIG. 3 and FIG. 4 are different. Since structures of light-emitting regions 011 in the display panel are basically repeated, FIGS. 3 and 4 each only show part of a structure of a light-emitting region 011 in the display panel as examples.

As shown in FIGS. 3 and 4, the display panel 1 includes a display substrate 11, and an encapsulation layer 12 for encapsulating the display substrate 11. The encapsulation layer 12 may be an encapsulation film or an encapsulation substrate.

In a case where the encapsulation layer 12 is an encapsulation film, the number of layers of films for encapsulation included in the encapsulation layer 12 is not limited. The encapsulation layer 12 may include one layer of film for encapsulation, or may include two or more layers of films for encapsulation which are stacked. In some embodiments, the encapsulation layer 12 includes three layers of films for encapsulation stacked in the thickness direction of the base substrate.

In a case where the encapsulation layer 12 includes three layers of films for encapsulation stacked, a film for encapsulation located in an intermediate layer is made of an organic material, and films for encapsulation located on both sides are made of an inorganic material.

In some embodiments of the present disclosure, the organic material is not limited, which may be, for example, polymethyl methacrylate (PMMA). Similarly, the inorganic material is not limited, which may be, for example, one or more of silicon nitride (SiNx), silicon oxide (SiOx) or silicon oxynitride (SiOxNy).

On this basis, an inkjet printing (IJP) process may be used for fabricating the organic film for encapsulation in the intermediate layer. In addition, a chemical vapor deposition (CVD) process may be used for fabricating the inorganic films for encapsulation on both sides.

As shown in FIGS. 3 and 4, the display substrate 11 includes a base substrate 110, and a plurality of light-emitting devices 120 disposed on the base substrate 110.

It will be easily understood that the base substrate 110 may be a blank substrate, or a substrate with a film structure.

In some embodiments, the base substrate 110 includes a blank substrate 111, and a plurality of pixel circuits disposed on the blank substrate 111.

In some embodiments, the blank substrate 111 may be a flexible blank substrate or a rigid blank substrate. The flexible blank substrate 111 may be made of, for example, polyimide (PI), and the rigid blank substrate 111 may be made of, for example, glass.

The base substrate 110 further includes gate lines arranged in a direction on the blank substrate 111, and data lines and common power lines insulated from and crossing the gate lines. The common power lines are generally parallel to the data lines. The plurality of sub-pixels may be defined with the gate lines and the data lines (and the common power lines) which are arranged crosswise. Each sub-pixel has a pixel circuit, and the pixel circuit is electrically connected to a light-emitting device 120 for driving the light-emitting device 120 to emit light.

The pixel circuit includes a plurality of thin film transistors and at least one capacitor, and each thin film transistor may have a top-gate structure or a bottom-gate structure. As shown in FIG. 3, in a case where the thin film transistor has a top-gate structure, the thin film transistor includes an active layer AL, a gate insulating layer GI, a gate metal layer GM (which forms a gate 112), an interlayer dielectric layer ILD and a source-drain metal layer SD (which forms a source 113 and a drain 114) that are disposed on the blank substrate 111 in sequence. As shown in FIG. 4, in a case where the thin film transistor has a bottom-gate structure, the thin film transistor includes a gate metal layer GM (which forms a gate 112), a portion of a gate insulating layer GI, an active layer AL and a source-drain metal layer SD (which forms a source 113 and a drain 114) that are disposed on the blank substrate 111 in sequence.

The active layer AL of the thin film transistor may be formed of amorphous silicon, monocrystalline silicon, polycrystalline silicon or oxide semiconductor. The active layer AL includes a channel region not doped with any impurity, and a source region and a drain region each formed by doping impurities on both sides of the channel region. The doped impurities vary with the type of the thin film transistor, and the doped impurities may be N-type impurities or P-type impurities.

The capacitor (not shown in FIGS. 3 and 4) includes a first electrode plate and a second electrode plate, between which an interlayer insulating film as a dielectric is to provided.

A 2T1C structure in which the pixel circuit includes two thin film transistors (i.e., a switch thin film transistor and a drive thin film transistor) and a capacitor is taken as an example to describe electrical connection relationships inside and outside the pixel circuit below. Although each of FIGS. 3 and 4 only shows structures and a connection relationship of the drive thin film transistor (i.e., a structure as showed in a dotted line circle in FIGS. 3 and 4) and the light-emitting device 120, a structure of the switch thin film transistor and its connection relationships with other components may be completely determined by those skilled in the art according to the description of the context.

A gate of the switch thin film transistor is connected to a gate line, a source of the switch thin film transistor is connected to a data line, and a drain of the switch thin film transistor is connected to a gate of the drive thin film transistor. A source of the drive thin film transistor is connected to a common power line, and a drain 114 of the drive thin film transistor is connected to a first electrode 121 of the light-emitting device 120 through a via hole. The first electrode plate of the capacitor is connected to the gate of the drive thin film transistor, and the second electrode plate of the capacitor is connected to the source of the drive thin film transistor.

The switch thin film transistor is turned on by a gate voltage applied to the gate line, thereby transmitting a data voltage applied to the data line to the drive thin film transistor. There is a certain difference between the data voltage transmitted from the switch thin film transistor to the drive thin film transistor and a common voltage applied from the common power line to the drive thin film transistor. A voltage equivalent to an absolute value of the difference is stored in the capacitor, and a current corresponding to the voltage stored in the capacitor flows into the light-emitting device 120 through the drive thin film transistor, so that the light-emitting device 120 emits light.

In some embodiments, as shown in FIGS. 3 and 4, the base substrate 110 further includes a planarization layer 115 disposed on the thin film transistors.

Figure 12:
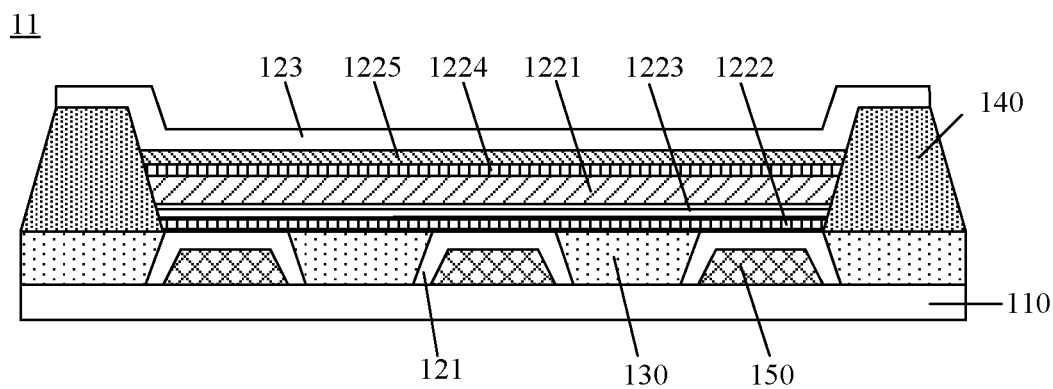
FIG. 12 is a schematic structural diagram of yet another display substrate, in accordance with some embodiments.

As shown in FIGS. 3, 4 and 12, the light-emitting devices 120 include the first electrodes 121, light-emitting functional layers 122 and a second electrode 123 that are disposed on the base substrate 110 in sequence. One of the first electrode 121 and the second electrode 123 is an anode (for providing holes) and the other is a cathode (for providing electrons). The first electrode 121 and the second electrode 123 inject holes and electrons into the light-emitting functional layer 122, respectively, and light is emitted when transitions of excitons generated by the combination of the holes and the electrons from an excited state to a ground state occur.

The first electrode 121 may be formed of a metal with high reflectivity, and the second electrode 123 may be formed of a transparent conductive film. In this case, light emitted by the light-emitting functional layer 122 is reflected by the first electrode 121 and then travels to the outside through the second electrode 123. Thus, a top-emission light-emitting device is formed. However, the solution is not limited thereto. In a case where the first electrode 121 is formed of a transparent conductive film, and the second electrode 123 is formed of a metal with high reflectivity, a bottom-emission light-emitting device may be formed. Of course, in a case where the first electrode 121 and the second electrode 123 are both formed of a transparent conductive film, a double-sided emission light-emitting device may be formed.

The transparent conductive film may be made of, for example, indium tin oxide (ITO), indium zinc oxide (IZO) or indium gallium zinc oxide (IGZO). The metal with high reflectivity may be, for example, Ag.

In some embodiments, the light-emitting functional layer 122 includes a light-emitting layer 1221. In some other embodiments, as shown in FIG. 12, the light-emitting functional layer 122 includes at least one of a hole injection layer (HIL) 1222, a hole transport layer (HTL) 1223, an electron transport layer (ETL) 1224 and an electron injection layer (EIL) 1225 in addition to the light-emitting layer 1221. In a case where all of the above layers are included, the hole injection layer 1222, the hole transport layer 1223, the light-emitting layer 1221, the electron transport layer 1224 and the electron injection layer 1225 are sequentially stacked on the first electrode 121 as the anode.

As shown in FIGS. 3 and 4, the display panel 1 further includes a pixel defining layer 131. The pixel defining layer 131 includes a plurality of opening regions. The light-emitting layers 1221 of a light-emitting device 120 is disposed in an opening region, so that portions of the light-emitting layers 1221 corresponding to the light-emitting devices 120 are isolated from each other by the pixel defining layer 131. In this case, when the light-emitting layer 1221 is formed on the planarization layer 115 by using the inkjet printing process, thicknesses of the light-emitting layers 1221 at some opening regions are non-uniform due to an error in the amount of ink between a plurality of nozzles, thereby leading to non-uniformity in brightness of light emitted from the light-emitting regions formed by the opening regions (a material for forming the light-emitting layers is sprayed in the opening regions, so that the opening regions become the light-emitting regions).

Figure 6A:
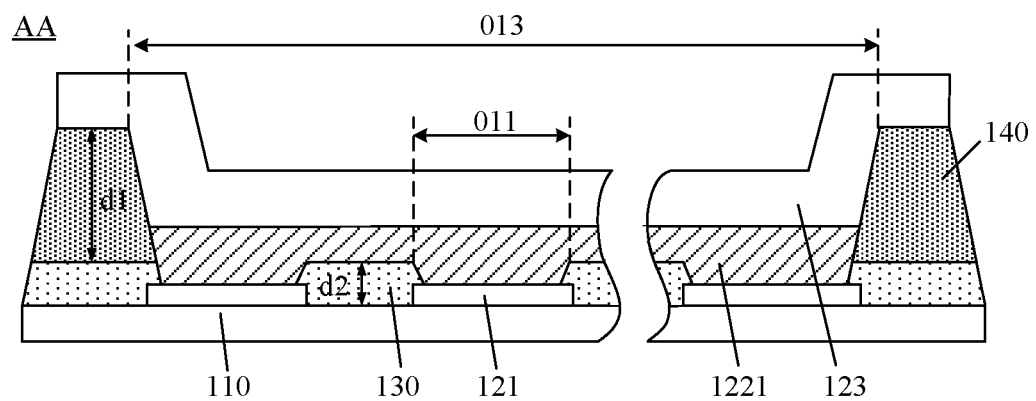
FIG. 6A is a schematic sectional view of the display substrate in FIG. 5 taken along the AA line.
Figure 6B:
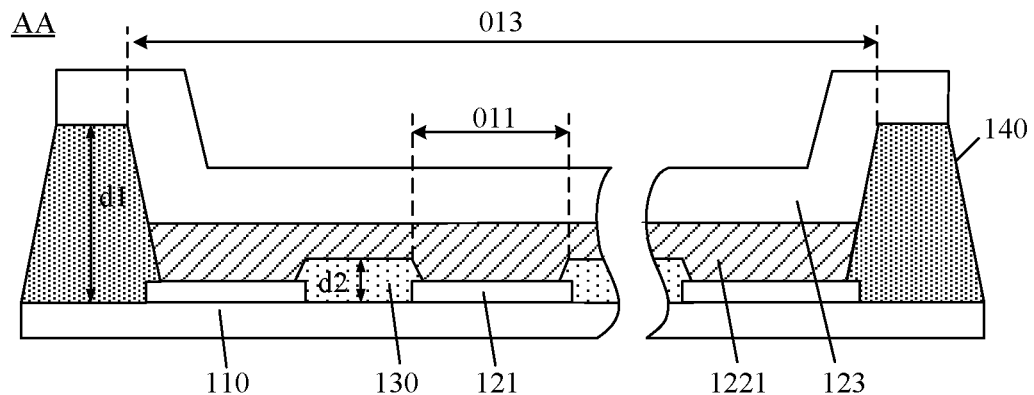
FIG. 6B is another schematic sectional view of the display substrate in FIG. 5 taken along the AA line.

Therefore, in some embodiments of the present disclosure, another display substrate 11 is provided. As shown in FIGS. 6A and 6B, in addition to the base substrate 110 and the plurality of light-emitting devices 120 disposed on the base substrate 110, the display substrate 11 further includes a first pixel defining layer 130 disposed on the base substrate 110 and a second pixel defining layer 140 disposed on the base substrate 110.

A material of the first pixel defining layer 130 and a material of the second pixel defining layer 140 are not limited in the embodiments of the present disclosure. In some embodiments, the material of the first pixel defining layer may or may not be the same as the material of the second pixel defining layer. In a case where the material of the first pixel defining layer 130 is the same as the material of the second pixel defining layer 140, the first pixel defining layer 130 and the second pixel defining layer 140 may be fabricated simultaneously to simplify a fabrication process.

In some embodiments, as shown in FIGS. 6A and 9 to 11, the second pixel defining layer 140 is located on the first pixel defining layer 130. In this way, a height d1 of the second pixel defining layer and a height d2 of the first pixel defining layer do not need to be too large, and a blocking portion with a sufficient height can be formed between two adjacent second opening regions 013. The blocking portion is a portion where the first pixel defining layer 130 and the second pixel defining layer 140 are stacked, so a height of the blocking portion is a sum of d1 and d2 (d1+d2). However, the solution is not limited thereto. In some embodiments, the second pixel defining layer 140 is not located on the first pixel defining layer 130.

For example, as shown in FIG. 6B, the second pixel defining layer 140 is directly disposed on the base substrate 110. In this way, since there does not exist a structure in which the first pixel defining layer 130 and the second pixel defining layer 140 are stacked, side faces of a second opening region 013 are continuous and flat, and light emitted by the light-emitting layer 1221 will not be refracted or scattered. Moreover, when the ink is injected into the second opening region 013, defects such as penetration will not occur at an interlayer interface between the first pixel defining layer 130 and the second pixel defining layer 140, and defects such as wrinkles will not occur at the interlayer interface between the first pixel defining layer 130 and the second pixel defining layer 140 after the ink is cured. In this case, when the material of the first pixel defining layer 130 is the same as the material of the second pixel defining layer 140, the first pixel defining layer 130 and the second pixel defining layer 140 may be fabricated simultaneously to simplify the fabrication process.

The first pixel defining layer 130 includes a plurality of first opening regions 011, and each first opening region 011 exposes at least a portion of a first electrode 121.

Figure 9:
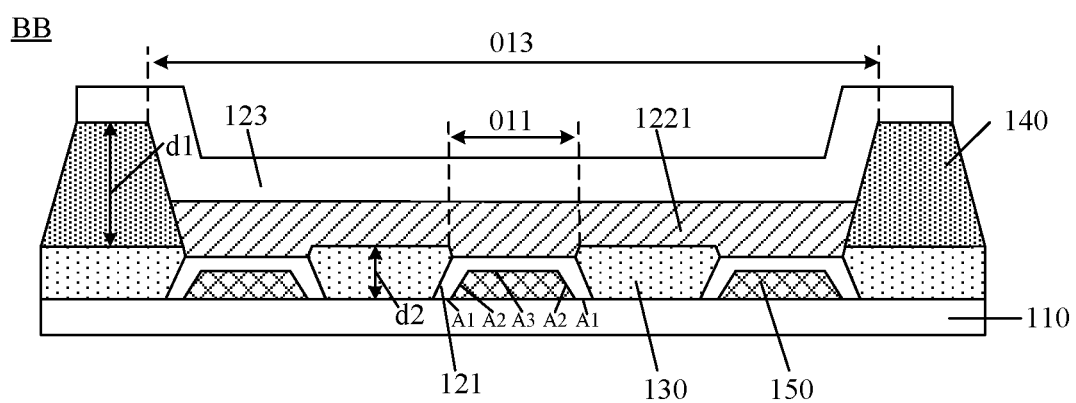
FIG. 9 is a sectional view of the display substrate in FIG. 8 taken along the BB line.
Figure 10:
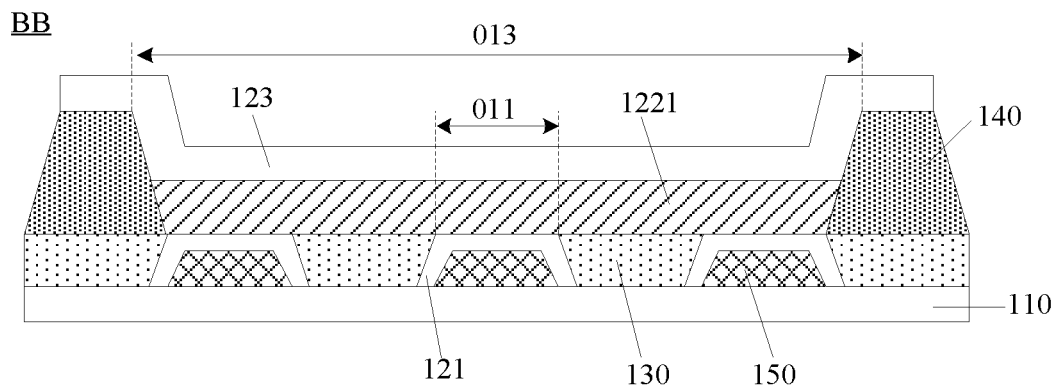
FIG. 10 is another sectional view of the display substrate in FIG. 8 taken along the BB direction.
Figure 11:
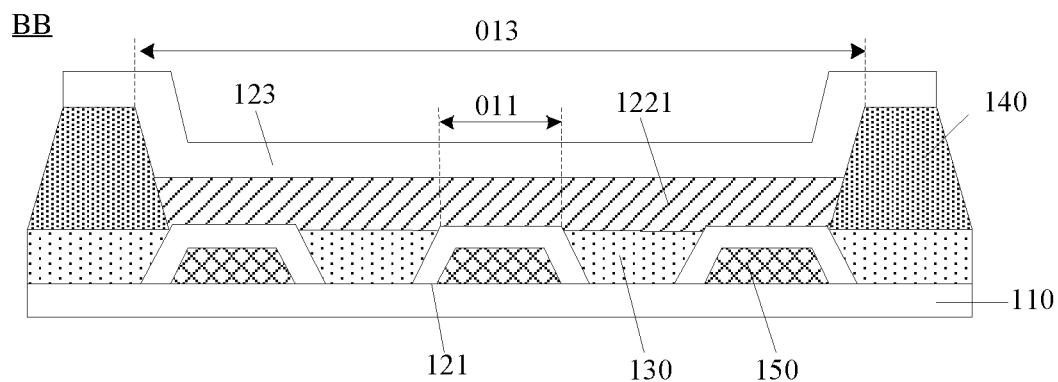
FIG. 11 is yet another sectional view of the display substrate in FIG. 8 taken along the BB direction.

In some embodiments, each first opening region 011 may expose a portion or the whole of a first electrode 121. As shown in FIGS. 6A to 6B, a bottom surface of the first opening region 011 is smaller than a surface of the first electrode 121 away from the base substrate 110, and thus one first opening region 011 exposes a portion of one first electrode 121. As shown in FIGS. 9 to 11, the bottom surface of the first opening region 011 is as large as the surface of the first electrode 121 away from the base substrate 110, and thus one first opening region 011 exposes the whole of one first electrode 121.

In some embodiments, as shown in FIGS. 6A and 6B, a shape of a cross section of the first electrode 121 is a long strip.

In some embodiments, as shown in FIGS. 9, 10 and 11, an orthographic projection of the surface of the first electrode 121 away from the base substrate 110 on the base substrate 110 is located within an orthographic projection of a surface of the first electrode 121 proximate to the base substrate 110 on the base substrate 110, and the surface of the first electrode 121 proximate to the base substrate 110 is a surface formed by a surface A1, a surface A3, and a side face A2 connecting and surrounding the surface A1 and the surface A3 shown in FIG. 9. That is, the shape of the cross section of the first electrode 121 is a regular trapezoid.

The second pixel defining layer 140 includes a plurality of second opening regions 013, and each second opening region 013 corresponds to at least two first opening regions 011. Orthogonal projections of the at least two first opening regions 011 on the base substrate 110 are located within an orthogonal projection of the second opening region 013 on the base substrate 110.

In some embodiments, the at least two first opening regions 011 may include only two first opening regions 011, or may include three or more first opening regions 011.

Since a first opening region 011 exposes at least a portion of a first electrode 121, a first opening region 011 corresponds to a first electrode 121, and the number of first opening regions 011 is the same as the number of first electrodes 121. On this basis, the number of first electrodes 121 exposed by the second opening region 013 may be two, three or more than three.

Figure 7:
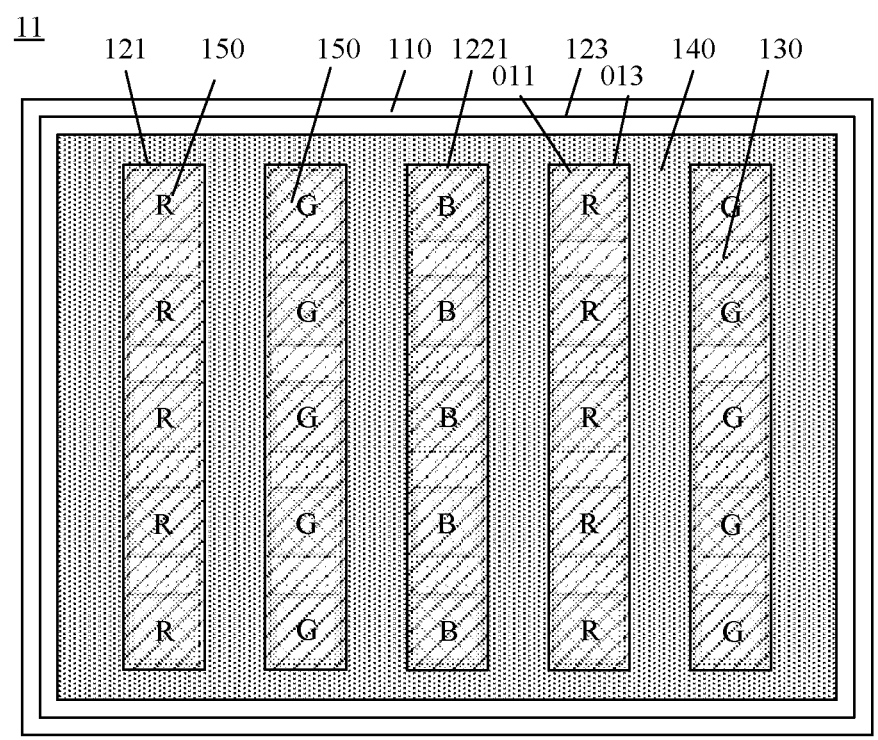
FIG. 7 is a schematic structural diagram of another display substrate, in accordance with some embodiments.
Figure 8:
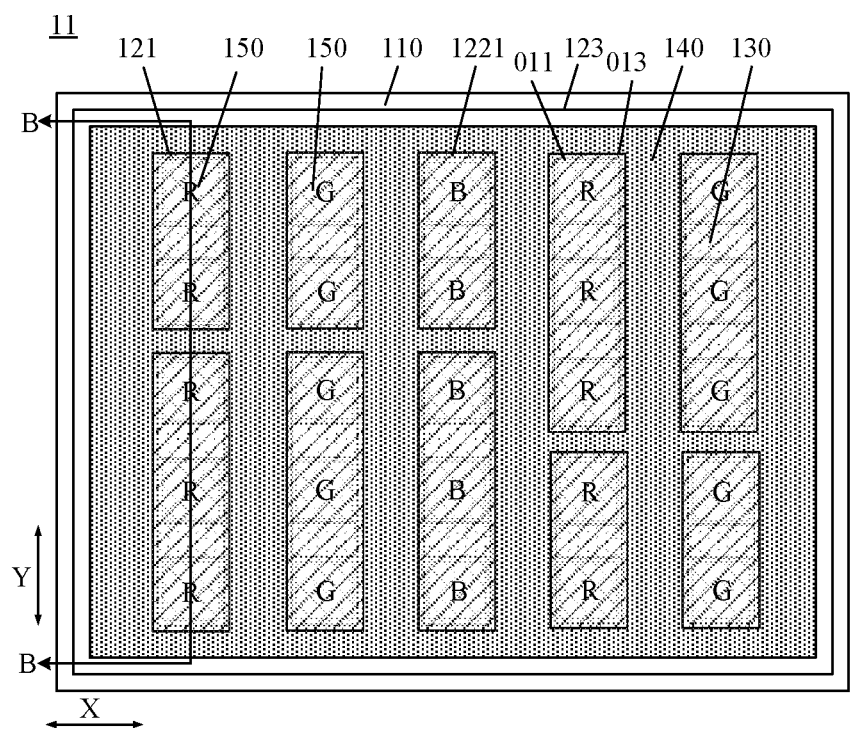
FIG. 8 is a schematic structural diagram of yet another display substrate, in accordance with some embodiments.

In some embodiments, the numbers of first electrodes 121 exposed by the second opening regions 013 may or may not be the same. For example, as shown in FIG. 7, a second opening region 013 exposes a column of first electrodes 121. For another example, as shown in FIG. 8, a second opening region 013 exposes two or three first electrodes 121.

The light-emitting layer 1221 is disposed in the second opening region 013 and overspreads the second opening region 013 in a plane perpendicular to a thickness direction of the base substrate 110.

It will be easily understood that, a region defined by the first opening region 011 is also referred to as a light-emitting region 011. A second opening region 013 corresponds to at least two first opening regions 011, that is, a second opening region 013 includes at least two light-emitting regions. Since the light-emitting layer 1221 is disposed in the second opening region 013 and overspreads the second opening region 013 in the plane perpendicular to the thickness direction of the base substrate 110, light emitted from all light-emitting regions 011 in the second opening region 013 has a same color.

The light-emitting layer 1221 overspreads the second opening region 013 in the plane perpendicular to the thickness direction of the base substrate 110, that is, a surface of the light-emitting layer 1221 away from the base substrate 110 is farther away from the base substrate 110 than a surface of the first pixel defining layer 130 away from the base substrate 110, which may make a thickness of the light-emitting layer 1221 in the second opening region more uniform, and improve uniformity of film formation.

In some embodiments, the second electrode 123 only covers the second opening region 013. That is, a plurality of second electrodes 123 are separated from each other by the second pixel defining layer 140. In some other embodiments, the second electrode 123 covers the second opening regions 013 and a surface of the second pixel defining layer 140 away from the base substrate 110.

In the display substrate 11 provided by some embodiments of the present disclosure, the second pixel defining layer 140 is disposed on the first pixel defining layer 130. That is, the surface of the first pixel defining layer 130 away from the base substrate 110 is closer to the base substrate 110 than the surface of the second pixel defining layer 140 away from the base substrate 110. The second pixel defining layer 140 includes the plurality of second opening regions 013, each second opening region 013 corresponds to the at least two first opening regions 011, and the orthogonal projections of the at least two first opening regions 011 on the base substrate 110 are all located within the orthogonal projection of the second opening region 013 on the base substrate 110.

In a case where the light-emitting layer 1221 is disposed in the second opening region 013, the light-emitting layer 1221 overspreads the second opening region 013 in the plane perpendicular to the thickness direction of the base substrate 110. As a result, when the ink is injected into the second opening region 013 by using the inkjet printing, the ink can flow among at least two light-emitting regions 011 defined by the second opening region 013, so that a difference of ink volume between light-emitting regions 011 in one second opening region 013 may be homogenized, thereby making thicknesses of the light-emitting layer 1221 formed in the light-emitting regions 011 in one second opening region 013 uniform.

In a case where the light-emitting devices 120 further include at least one of the hole injection layer 1222, the hole transport layer 1223, the electron transport layer 1224 and the electron injection layer 1225, the layer(s) may each be located only in the second opening region 013. That is, films disposed in a same layer may be separated by the second pixel defining layer 140. Alternatively, the layer(s) may cover the second opening regions 013 and the surface of the second pixel defining layer 140 away from the base substrate 110. That is, the layer(s) are whole layer(s).

In some embodiments, as shown in FIG. 9, the surface of the first electrode 121 away from the base substrate 110 is closer to the base substrate 110 than the surface of the first pixel defining layer 130 away from the base substrate 110. In this way, the first pixel defining layer 130 may prevent light mixing between two adjacent light-emitting devices 120. Although the light emitted by the light-emitting layer 1221 in the same second opening region 013 has a same color, considering that each light-emitting device 120 needs to emit light independently to improve a pixel resolution, light mixing between two adjacent light-emitting devices still needs to be avoided in each second opening region 013.

However, the solution is not limited thereto. In some other embodiments, as shown in FIG. 10, the surface of the first electrode 121 away from the base substrate 110 is as close to the base substrate 110 as the surface of the first pixel defining layer 130 away from the base substrate 110. That is, the surface of the first electrode 121 away from the base substrate 110 and the surface of the first pixel defining layer 130 away from the base substrate 110 are located in a same plane parallel to the base substrate 110. In yet some other embodiments, as shown in FIG. 11, the surface of the first electrode 121 away from the base substrate 110 is farther away from the base substrate 110 than the surface of the first pixel defining layer 130 away from the base substrate 110. In these two cases mentioned above, when the ink is injected into the second opening region 013, the ink is entirely located on the interlayer interface between the first pixel defining layer 130 and the second pixel defining layer 140, and thus defects such as penetration will not occur at the interlayer interface between the first pixel defining layer 130 and the second pixel defining layer 140, and defects such as wrinkles will not occur at the interlayer interface between the first pixel defining layer 130 and the second pixel defining layer 140 after the ink is cured, and further the light emitted by the light-emitting layer 1221 will not be refracted or scattered at the wrinkles.

As shown in FIG. 10, in a case where the surface of the first pixel defining layer 130 away from the base substrate 110 and the surface of the first electrode 121 away from the base substrate 110 are located in the same plane, when the ink is injected into the second opening region 013 of the second pixel defining layer 140 to form the light-layer 1221, a surface in contact with the ink is flat. Therefore, it is further ensured that the thicknesses of the light-emitting layer 1221 formed in all light-emitting regions 011 in the second opening region 013 are same, and brightness uniformity of light emitted from all light-emitting regions 011 is further improved.

In a case where the light-emitting layer 1221 is formed by using the inkjet printing process, the second pixel defining layer 140 is used to define the flowing of ink in the second opening region 013, and thus the height of the second pixel defining layer 140 will be set relatively large. On this basis, in some embodiments, as shown in FIG. 6A, a height d1 of the second pixel defining layer 140 is greater than a height d2 of the first pixel defining layer 130. The height d1 of the first pixel defining layer 130 and the height d2 of the second pixel defining layer 140 each refer to a dimension in the thickness direction of the base substrate 110.

In some embodiments, directions in which the first electrodes 121 exposed by the plurality of second opening regions 013 are respectively arranged are all the same. That is, directions in which the light-emitting regions 011 included in the plurality of second opening regions 013 are respectively arranged are the same.

For example, a plurality of first electrodes 121 exposed by each second opening region 013 are arranged in a column direction. Alternatively, a plurality of first electrodes 121 exposed by each second opening region 013 are arranged in a row direction.

In some embodiments, as shown in FIG. 7, an orthogonal projection of a second opening region 013 on the base substrate 110 covers orthogonal projections of a column of first opening regions 011 on the base substrate 110. Alternatively, an orthogonal projection of a second opening region 013 on the base substrate 110 covers orthogonal projections of a row of first opening regions 011 on the base substrate 110.

In some embodiments, as shown in FIG. 8, an orthogonal projection of a second opening region 013 on the base substrate 110 covers orthogonal projections of part of opening regions in a column of first opening regions 011 on the base substrate 110. Alternatively, an orthogonal projection of a second opening region 013 on the base substrate 110 covers orthogonal projections of part of opening regions in a row of first opening regions 011 on the base substrate 110.

In some embodiments of the present disclosure, since the directions in which the first electrodes 121 exposed by the plurality of second opening regions 013 are respectively arranged are all the same, it is convenient to fabricate the light-emitting layers 1221.

In some embodiments, as shown in FIGS. 9 to 11, the display substrate 11 further includes a plurality of auxiliary patterns 150 disposed between the base substrate 110 and the plurality of first electrodes 121, and a first electrode 121 is disposed on an auxiliary pattern 150.

A material of the auxiliary patterns 150 is not limited. In a case where the light emitted by the light-emitting layer 1221 exits from the first electrodes 121, the material of the auxiliary patterns 150 should be a transparent material. In a case where the light emitted by the light-emitting layer 1221 exits from the second electrode 123, the material of the auxiliary patterns 150 may be a transparent material or a non-transparent material.

Figure 13A:
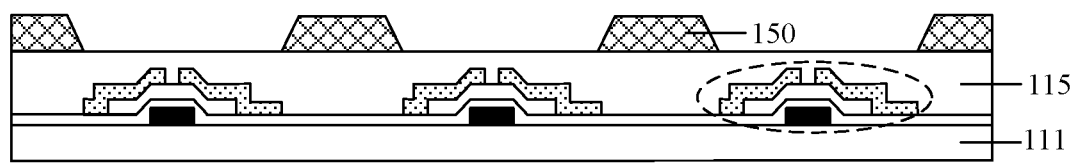
FIG. 13A is a schematic diagram showing a structure including auxiliary patterns and a planarization layer, in accordance with some embodiments.
Figure 13B:
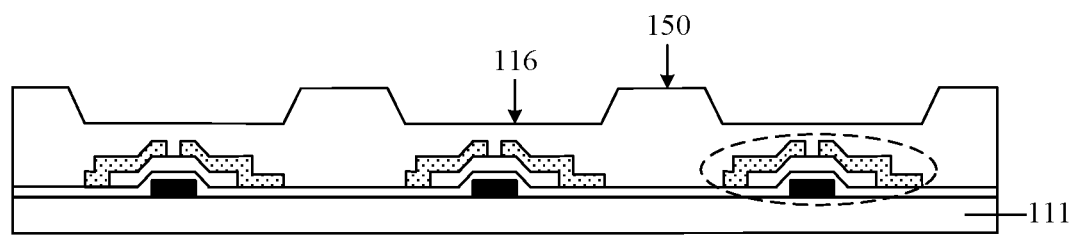
FIG. 13B is a schematic diagram showing another structure including auxiliary patterns and a planarization layer, in accordance with some embodiments.

In some embodiments, the material of the auxiliary patterns 150 is the same as a material of the planarization layer 115. On this basis, the auxiliary patterns 150 and the planarization layer 115 may be fabricated simultaneously or separately. In a case where the auxiliary patterns 150 and the planarization layer 115 are fabricated separately, as shown in FIG. 13A, the planarization layer 115 is firstly formed on surfaces of the pixel circuits, and then the auxiliary patterns 150 are formed. In a case where the auxiliary patterns 150 and the planarization layer 115 are fabricated simultaneously, in some embodiments, as shown in FIG. 13B, the planarization film 116 is formed on the surfaces of the pixel circuits, and then the planarization film 116 is etched to form convex portions and concave portions. In this case, the convex portions are the auxiliary patterns 150.

Since the first electrode 121 is disposed on the auxiliary pattern 150, a difference in height between the surface of the first electrode 121 away from the base substrate 110 and the surface of the first pixel defining layer 130 away from the base substrate 110 is reduced. In this way, when the ink is injected into the second opening region 013 of the second pixel defining layer 140 in a process of forming the light-emitting layer 1221 by using the inkjet printing process, the ink can flow more uniformly among the light-emitting regions 011 included in the second opening region 013, thereby improving uniformity of thicknesses of the light-emitting layer 1221 formed in all light-emitting regions 011, and further improving the brightness uniformity of the light emitted from the light-emitting regions 011. In a case where the display substrate 11 is applied in an electroluminescent display apparatus, a quality of the electroluminescent display apparatus may be improved.

In some embodiments, an orthographic projection of a surface of the auxiliary pattern 150 away from the base substrate 110 on the base substrate 110 is located within an orthographic projection of a surface of the auxiliary pattern 150 proximate to the base substrate 110 on the base substrate 110. Referring to FIGS. 9, 10 and 11, it can be seen that a shape of a cross section of the auxiliary pattern 150 is a regular trapezoid. On this basis, the first electrode 121 covers the surface of the auxiliary pattern 150 away from the base substrate 110 and side faces of the auxiliary pattern 150.

Since the shape of the cross section of the auxiliary pattern 150 is the regular trapezoid, in a case where the first electrode 121 covers the auxiliary pattern 150, the first electrode 121 can be prevented from being broken. Further, since the first electrode 121 is electrically connected to the drain 114 of the drive thin film transistor, the first electrode 121 can be prevented from being disconnected from the drain 114 of the drive thin film transistor.

As shown in FIGS. 9, 10 and 11, the first pixel defining layer 130 covers side faces of each first electrode 121, and an orthographic projection of a surface of the first pixel defining layer 130 proximate to the base substrate 110 on the base substrate 110 is located within an orthographic projection of the surface of the first pixel defining layer 130 away from the base substrate 110 on the base substrate 110. That is, a shape of a cross section of a portion of the first pixel defining layer 130 located between two adjacent first electrodes 121 is an inverted trapezoid.

Based on the above, it will be seen that two adjacent first electrodes 121 are separated by the first pixel defining layer 130, and thus the first pixel defining layer 130 can insulate two adjacent first electrodes 121 from each other, which may avoid a short circuit.

As shown in FIGS. 6A, 6B and 9 to 11, an orthographic projection of the surface of the second pixel defining layer 140 away from the base substrate 110 on the base substrate 110 is located within an orthographic projection of a surface of the second pixel defining layer 140 proximate to the base substrate 110 on the base substrate 110. That is, a shape of a cross section of a portion of the second pixel defining layer 140 located between two adjacent second opening regions 013 is a regular trapezoid.

In some embodiments of the present disclosure, the shape of the cross section of the portion of the second pixel defining layer 140 located between two adjacent second opening regions 013 is a regular trapezoid, thereby facilitating fabrication of the second pixel defining layer 140. In addition, since the height of the second pixel defining layer 140 is relatively large, in a case where the light-emitting layer 1221 is formed in each second opening region 013, it may be possible to prevent the ink for the inkjet printing from flowing into an adjacent second opening region 013, and thus prevent color mixing of the light-emitting layers 1221 in two adjacent second opening regions 013.

In some embodiments, the second opening regions 013 may be classified into first sub-opening regions, second sub-opening regions and third sub-opening regions. The light-emitting layers 1221 include red light-emitting layers for emitting red light located in the first sub-opening regions, green light-emitting layers for emitting green light located in the second sub-opening regions and blue light-emitting layers for emitting blue light located in the third sub-opening regions.

Shapes and arrangement manners of the first sub-opening region, the second sub-opening region and the third sub-opening region are not limited. For example, the first sub-opening region, the second sub-opening region and the third sub-opening region all extend in a first direction Y shown in FIG. 8, and the first sub-opening region, the second sub-opening region and the third sub-opening region are alternately arranged in a second direction X shown in FIG. 8. The first direction Y intersects with the second direction X. For example, the first direction Y is perpendicular to the second direction X.

Figure 14:
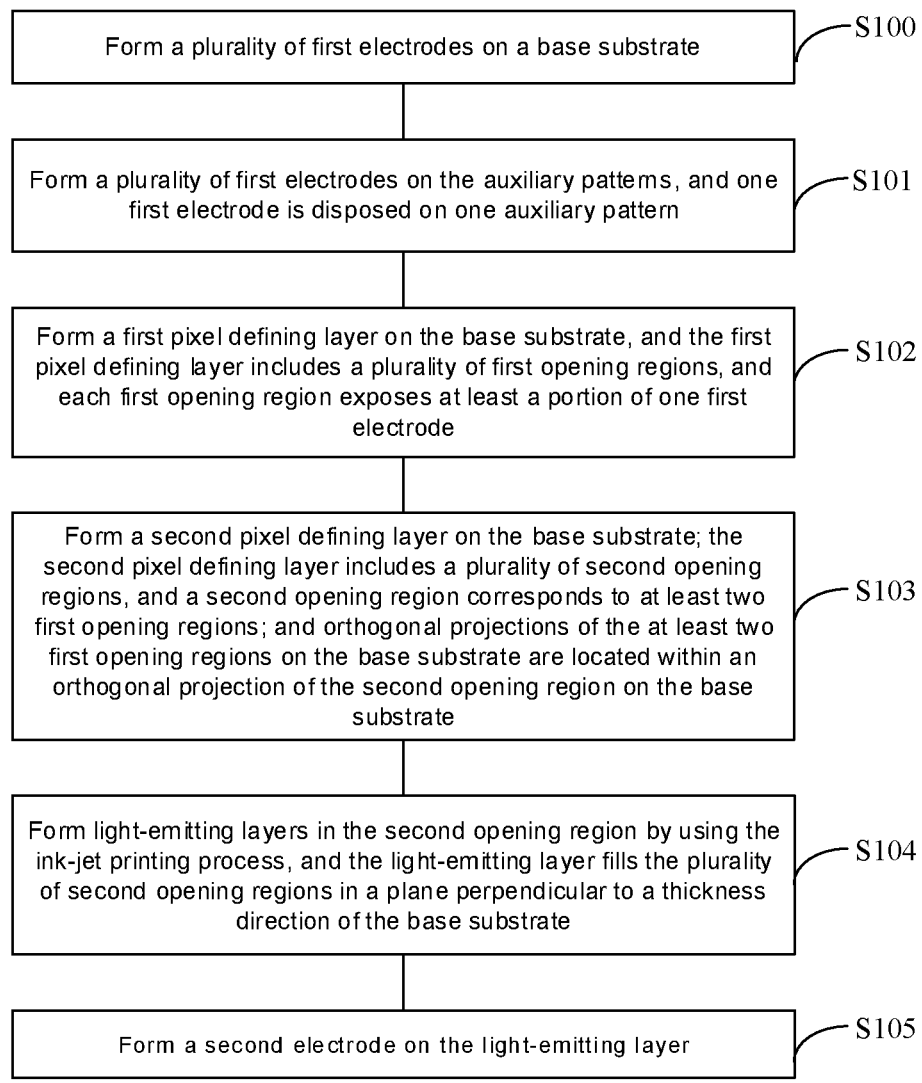
FIG. 14 is a schematic flow diagram of a method for manufacturing a display substrate, in accordance with some embodiments.

Some embodiments of the present disclosure provide a method for manufacturing a display substrate, and the method may be used to manufacture the above display substrate. The method for manufacturing the display substrate, as shown in FIG. 14, includes following steps.

Figure 15:
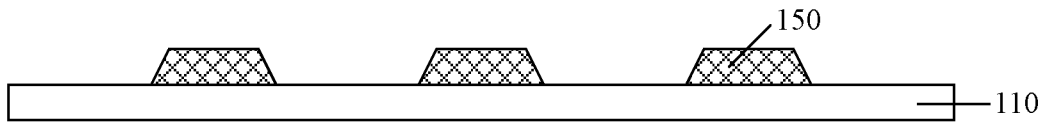
FIG. 15 is a schematic diagram of forming auxiliary patterns on a base substrate, in accordance with some embodiments.

In S100, as shown in FIG. 15, a plurality of auxiliary patterns 150 are formed on a base substrate 110.

A structure of the base substrate 110 is not limited, which may be referred to the above description, and will not be described in detail herein.

Figure 16:
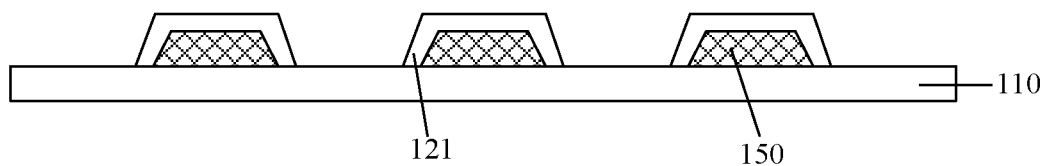
FIG. 16 is a schematic diagram of forming first electrodes on auxiliary patterns, in accordance with some embodiments.

In S101, as shown in FIG. 16, a plurality of first electrodes 121 are formed on the auxiliary patterns 150, and one first electrode 121 is disposed on one auxiliary pattern 150.

In some embodiments, the first electrode 121 covers a surface of the auxiliary pattern 150 away from the base substrate 110. In some other embodiments, the first electrode 121 covers a partial region of the surface of the auxiliary pattern 150 away from the base substrate 110.

In some embodiments, the S100 is not essential, and the plurality of first electrodes 121 may be formed on the base substrate 110.

Figure 17:
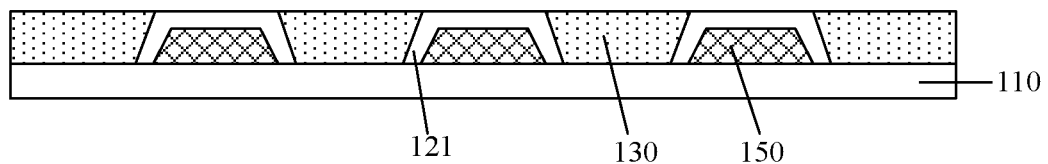
FIG. 17 is a schematic diagram of forming a first pixel defining layer on first electrodes, in accordance with some embodiments.

In S102, as shown in FIG. 17, a first pixel defining layer 130 is formed on the base substrate 110. The first pixel defining layer 130 includes a plurality of first opening regions 011, and each first opening region 011 exposes at least a portion of a first electrode 121.

Herein, a first opening region 011 defines a light-emitting region, and a light-emitting region 011 corresponds to a first electrode 121.

Figure 18:
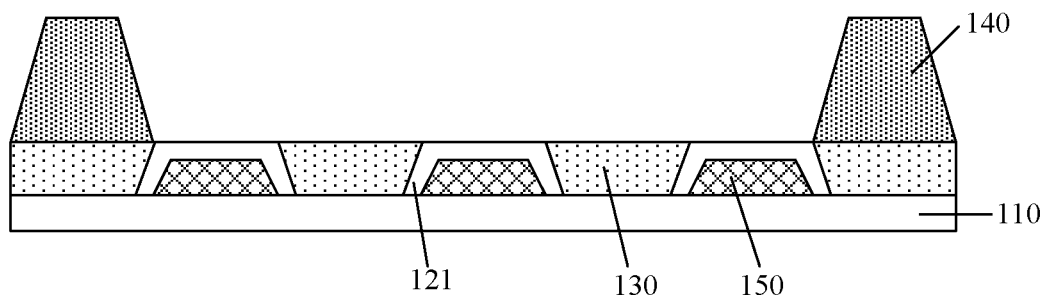
FIG. 18 is a schematic diagram of forming a second pixel defining layer on a first pixel defining layer, in accordance with some embodiments.

In S103, as shown in FIG. 18, a second pixel defining layer 140 is formed on the base substrate 110. The second pixel defining layer 140 includes a plurality of second opening regions 013, and a second opening region 013 corresponds to at least two first opening regions 011. Orthogonal projections of the at least two first opening regions 011 on the base substrate 110 are located within an orthogonal projection of the second opening region 013 on the base substrate 110.

Herein, a material of the first pixel defining layer 130 may or may not be the same as a material of the second pixel defining layer 140.

Since a light-emitting region 011 corresponds to a first electrode 121, the number of light-emitting regions 011 defined by the second opening region 013 is the same as the number of first electrodes 121 exposed by the second opening region 013.

In a case where the light-emitting layer 1221 is formed by using the inkjet printing process, the second pixel defining layer 140 is used to define the flowing of ink in the second opening region 013, and thus a height of the second pixel defining layer 140 will be set relatively large. On this basis, in some embodiments, the height of the second pixel defining layer 140 is greater than a height of the first pixel defining layer 130.

As described above, in some embodiments, as shown in FIGS. 6A and 18, the second pixel defining layer 140 is located on the first pixel defining layer 130, thereby forming a stacked structure. In some embodiments, as shown in FIG. 6B, the first pixel defining layer 130 and the second pixel defining layer 140 may not form a stacked structure, and the second pixel defining layer 140 is directly formed on the base substrate 110. That is, only the first pixel defining layer 130 is still formed at the position where only the first pixel defining layer 130 is formed shown in FIG. 18, and only the second pixel defining layer 140 is formed at the position where the first pixel defining layer 130 and the second pixel defining layer 140 are stacked shown in FIG. 18.

Figure 19:
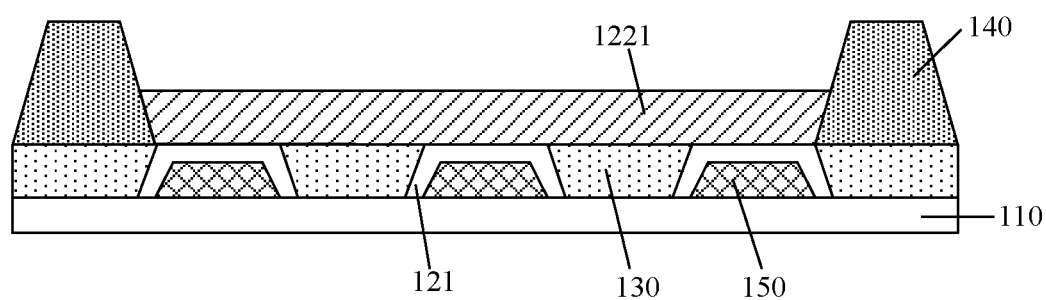
FIG. 19 is a schematic diagram of forming a light-emitting layer in a second opening region of a second pixel defining layer, in accordance with some embodiments.

In S104, as shown in FIG. 19, light-emitting layers 1221 are formed in the second opening regions 013 by using the inkjet printing process. The light-emitting layers 1221 overspread the plurality of second opening regions 013 in a plane perpendicular to a thickness direction of the base substrate 110.

It will be understood that, in a case where the light-emitting layer 1221 is formed by using the inkjet printing process, since the ink flows in the second opening region 013, light emitted from all light-emitting regions 011 in the second opening region 013 has a same color.

In S105, as shown in FIGS. 9 to 11, a second electrode 123 is formed on the light-emitting layer 1221.

In some embodiments, the second electrode 123 only covers the second opening region 013. In some other embodiments, the second electrode 123 covers the second opening regions 013 and a surface of the second pixel defining layer 140 away from the base substrate 110.

Herein, the second electrode 123 may be formed on the light-emitting layer 1221 by using a sputtering process or an evaporation process.

The method for manufacturing the display substrate provided by some embodiments of the present disclosure has the same beneficial effects as the display substrate 11 as described above, and the beneficial effects will not be described in detail herein.

In a case where the first electrode 121 is an anode and the second electrode 123 is a cathode, in some embodiments, after the S103 and before the S104, the method for manufacturing the display substrate further includes: forming a hole injection layer 1222 and/or a hole transport layer 1223 at least in the second opening region 013; and/or, after the S104 and before the S105, the method for manufacturing the display substrate further includes: forming an electron injection layer 1225 and/or an electron transport layer 1224 on the light-emitting layer 1221 and at least in the second opening region 013.

In a case where the first electrode 121 is a cathode and the second electrode 123 is an anode, in some embodiments, after the S103 and before the S104, the method for manufacturing the display substrate further includes: forming the electron injection layer 1225 and/or the electron transport layer 1224 at least in the second opening region 013; and/or, after the S104 and before the S105, the method of manufacturing the display substrate further includes: forming the hole injection layer 1222 and/or the hole transport layer 1223 on the light-emitting layer 1221 and at least in the second opening region 013.

Based on the above, the hole injection layer 1222, the hole transport layer 1223, the electron injection layer 1225 and the electron transport layer 1224 may be formed by using the inkjet printing process. The hole injection layer 1222, the hole transporting layer 1223, the electron injection layer 1225 and the electron transporting layer 1224 may also be formed by using the evaporation process.

On this basis, the hole injection layer 1222, the hole transport layer 1223, the electron injection layer 1225 and the electron transport layer 1224 may be formed only in the second opening region 013. The hole injection layer 1222, the hole transporting layer 1223, the electron injection layer 1225 and the electron transport layer 1224 may also be formed in the second opening regions 013 and the surface of the second pixel defining layer 140 away from the base substrate 110. That is, the hole injection layer 1222 and the hole transport layer 1223 are each a whole layer, or the electron injection layer 1225 and the electron transport layer 1224 are each a whole layer.

In some embodiments, the S104 includes:

forming a red light-emitting layer for emitting red light in a first sub-opening region, a green light-emitting layer for emitting green light in a second sub-opening region and a blue light-emitting layer for emitting blue light in a third sub-opening region by using inkjet printing processes. The second opening region 013 is classified into the first sub-opening region, the second sub-opening region or the third sub-opening region.

Herein, an order of forming the red light-emitting layer, the green light-emitting layer and the blue light-emitting layer is not limited. For example, the red light-emitting layer is first formed in the first sub-opening region by using an inkjet printing process, and the green light-emitting layer is then formed in the second sub-opening region by using another inkjet printing process, and the blue light-emitting layer is finally formed in the third sub-opening region by using yet another inkjet printing process. For another example, the green light-emitting layer is first formed in the second sub-opening region by using an inkjet printing process, and the blue light-emitting layer is then formed in the third sub-opening region by using another inkjet printing process, and the red light-emitting layer is finally formed in the first sub-opening region by using yet another inkjet printing process.

Shapes and arrangement manners of the first sub-opening region, the second sub-opening region and the third sub-opening region are not limited. For example, the first sub-opening region, the second sub-opening region and the third sub-opening region all extend in a first direction Y shown in FIG. 8, and the first sub-opening region, the second sub-opening region and the third sub-opening region are alternately arranged in a second direction X shown in FIG. 8. The first direction Y intersects with the second direction X. For example, the first direction Y is perpendicular to the second direction X.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
    a base substrate;
    a plurality of first electrodes disposed on the base substrate;
    a first pixel defining layer disposed on the base substrate, the first pixel defining layer including a plurality of first opening regions, and each first opening region exposing at least a portion of a first electrode of the plurality of first electrodes;
    a second pixel defining layer disposed on the base substrate, the second pixel defining layer including a plurality of second opening regions, each second opening region corresponding to at least two first opening regions of the plurality of first opening regions, and orthogonal projections of the at least two first opening regions on the base substrate being located within an orthogonal projection of the second opening region on the base substrate;
    light-emitting layers disposed in the plurality of second opening regions, the light-emitting layers overspreading the plurality of second opening regions in a plane perpendicular to a thickness direction of the base substrate, respectively; and
    a plurality of auxiliary patterns disposed between the base substrate and the plurality of first electrodes, the first electrode being disposed on a surface of an auxiliary pattern away from the base substrate.

2. The display substrate according to claim 1, wherein a surface of the first electrode away from the base substrate is closer to the base substrate than a surface of the first pixel defining layer away from the base substrate.

3. The display substrate according to claim 1, wherein a surface of the first electrode away from the base substrate is as close to the base substrate as a surface of the first pixel defining layer away from the base substrate.

4. The display substrate according to claim 1, wherein a surface of the first electrode away from the base substrate is farther away from the base substrate than a surface of the first pixel defining layer away from the base substrate.

5. The display substrate according to claim 1, wherein an orthogonal projection of a surface of the auxiliary pattern away from the base substrate on the base substrate is located within an orthogonal projection of a surface of the auxiliary pattern proximate to the base substrate on the base substrate.

6. The display substrate according to claim 5, wherein the first electrode covers a surface of the auxiliary pattern away from the base substrate and side faces of the auxiliary pattern.

7. The display substrate according to claim 6, wherein an orthogonal projection of a surface of the first electrode away from the base substrate on the base substrate is located within an orthogonal projection of a surface of the first electrode proximate to the base substrate on the base substrate.

8. The display substrate according to claim 6, wherein the first pixel defining layer covers side faces of the first electrode.

9. The display substrate according to claim 1, wherein the first pixel defining layer is directly disposed on the base substrate, and the second pixel defining layer is disposed on a surface of the first pixel defining layer away from the base substrate; or
    the first pixel defining layer and the second pixel defining layer are both directly disposed on the base substrate.

10. The display substrate according to claim 1, wherein an orthographic projection of a surface of the first pixel defining layer proximate to the base substrate on the base substrate is located within an orthographic projection of a surface of the first pixel defining layer away from the base substrate on the base substrate; and
    an orthographic projection of a surface of the second pixel defining layer away from the base substrate on the base substrate is located within an orthographic projection of a surface of the second pixel defining layer proximate to the base substrate on the base substrate.

11. The display substrate according to claim 1, wherein a material of the first pixel defining layer is the same as a material of the second pixel defining layer.

12. The display substrate according to claim 1, wherein a height of the second pixel defining layer is greater than a height of the first pixel defining layer, and the height of the first pixel defining layer and the height of the second pixel defining layer each refer to a dimension in the thickness direction of the base substrate.

13. The display substrate according to claim 1, wherein the second opening region corresponds to a row of first opening regions, and the row of first opening regions correspond to a same color; or
    the second opening region corresponds to a column of first opening regions, and the column of first opening regions correspond to a same color.

14. The display substrate according to claim 1, wherein the second opening region corresponds to part of first opening regions in a row of first opening regions, and the part of first opening regions correspond to a same color; or
    the second opening region corresponds to part of first opening regions in a column of first opening regions, and the part of first opening regions correspond to a same color.

15. The display substrate according to claim 1, wherein the display substrate further comprises a second electrode disposed on the light-emitting layer; and
    one of the first electrode and the second electrode is an anode, and another is a cathode.

16. A display panel, comprising the display substrate according to claim 1 and an encapsulation layer encapsulating the display substrate.

17. A display apparatus, comprising the display panel according to claim 16.

18. A method for manufacturing a display substrate, the method comprising:
    forming a plurality of first electrodes on a base substrate;
    forming a first pixel defining layer on the base substrate, the first pixel defining layer including a plurality of first opening regions, and each first opening region exposing at least a portion of a first electrode in the plurality of first electrodes;

forming a second pixel defining layer on the base substrate, the second pixel defining layer including a plurality of second opening regions, each second opening region corresponding to at least two first opening regions in the plurality of first opening regions, and orthogonal projections of the at least two first opening regions on the base substrate being located within an orthogonal projection of the second opening region on the base substrate; and forming light-emitting layers in the second opening regions, the light-emitting layers overspreading the second opening regions in a plane perpendicular to a thickness direction of the base substrate, respectively;

wherein before forming the plurality of first electrodes on the base substrate, the method further comprises:

forming a plurality of auxiliary patterns on the base substrate, a first electrode being disposed on an auxiliary pattern.

19. A display substrate, comprising:

a base substrate;

a plurality of first electrodes disposed on the base substrate;

a first pixel defining layer disposed on the base substrate, the first pixel defining layer including a plurality of first opening regions, and each first opening region exposing at least a portion of a first electrode of the plurality of first electrodes;

a second pixel defining layer disposed on the base substrate, the second pixel defining layer including a plurality of second opening regions, each second opening region corresponding to at least two first opening regions of the plurality of first opening regions, and orthogonal projections of the at least two first opening regions on the base substrate being located within an orthogonal projection of the second opening region on the base substrate; and light-emitting layers disposed in the plurality of second opening regions, the light-emitting layers overspreading the plurality of second opening regions in a plane perpendicular to a thickness direction of the base substrate, respectively, wherein a surface of the first electrode away from the base substrate is as close to the base substrate as a surface of the first pixel defining layer away from the base substrate; or a surface of the first electrode away from the base substrate is farther away from the base substrate than a surface of the first pixel defining layer away from the base substrate.

\* \* \* \* \*